United States Patent
Mackey et al.

(10) Patent No.: US 9,130,316 B2
(45) Date of Patent: Sep. 8, 2015

(54) PROTECTION OF UNSEALED ELECTRICAL CONNECTORS

(71) Applicant: Harris Corporation, Melbourne, FL (US)

(72) Inventors: Christopher D. Mackey, Spencerport, NY (US); Scott E. Bartholomew, Webster, NY (US); Duncan G. Harris, Webster, NY (US)

(73) Assignee: HARRIS CORPORATION, Melbourne, FL (US)

( * ) Notice: Subject to any disclaimer, the term of this patent is extended or adjusted under 35 U.S.C. 154(b) by 571 days.

(21) Appl. No.: 13/645,847

(22) Filed: Oct. 5, 2012

(65) Prior Publication Data

US 2013/0027054 A1 Jan. 31, 2013

Related U.S. Application Data

(62) Division of application No. 12/789,543, filed on May 28, 2010, now Pat. No. 8,299,803.

(51) Int. Cl.
*G01R 31/04* (2006.01)
*H01R 13/66* (2006.01)
*H01R 13/52* (2006.01)

(52) U.S. Cl.
CPC .......... *H01R 13/6683* (2013.01); *G01R 31/045* (2013.01); *H01R 13/521* (2013.01)

(58) Field of Classification Search
CPC . H01R 13/6683; H01R 13/521; G01R 31/045
USPC .......... 324/755.11, 756.04, 538, 555, 762.01, 324/755.07, 537, 511, 522, 525; 714/718–725, 735–738, 741
See application file for complete search history.

(56) References Cited

U.S. PATENT DOCUMENTS

| | | | |
|---|---|---|---|
| 3,496,500 | A | 2/1970 | Romary |
| 5,097,213 | A | 3/1992 | Hunting et al. |
| 5,167,535 | A | 12/1992 | Kovacik et al. |
| 6,433,445 | B1 | 8/2002 | Ahladas et al. |
| 7,129,733 | B2 | 10/2006 | Savagaonkar et al. |
| 2002/0157932 | A1 | 10/2002 | DeWitt et al. |
| 2004/0036273 | A1 | 2/2004 | McClary |
| 2006/0245131 | A1 | 11/2006 | Ramey et al. |
| 2009/0128977 | A1 | 5/2009 | Christensen |

FOREIGN PATENT DOCUMENTS

| | | |
|---|---|---|
| DE | 102006047039 | 11/2007 |
| DE | 202008009929 | 12/2009 |

*Primary Examiner* — Melissa Koval
*Assistant Examiner* — Trung Nguyen
(74) *Attorney, Agent, or Firm* — Harness, Dickey & Pierce, P.L.C.

(57) ABSTRACT

A monitoring system for connector pins exposed to conductive/corrosive fluids and/or corrosive environments includes a first sensing portion having a pin monitoring section configured to measure a pin current flow of at least one conductor pin, and transfer a first signal. A second sensing portion produces a second signal indicating by a contactless determination the presence of a fastener providing physical connection between an interface member and a component. A decision logic device receives the first and second signals, compares the pin current flow to a predetermined range of values, and isolates electrical power to the conductor pin when the first signal indicates the pin current flow is outside the predetermined range of values. A sensor body created of a non-ferrous material and connected to the component includes a first insert member having the conductor pin and a second insert member defining a sensor sensing proximal presence of the fastener.

19 Claims, 3 Drawing Sheets

PROTECTION OF UNSEALED ELECTRICAL CONNECTORS

CROSS-REFERENCE TO RELATED APPLICATION

This application is a divisional of U.S. Ser. No. 12/789,543 filed May 28, 2010. The disclosure of the above application is incorporated herein by reference.

FIELD

The present disclosure relates to electrical devices having connectors degraded when exposed to conductive/corrosive fluids and including corrosive environments.

BACKGROUND

This section provides background information related to the present disclosure which is not necessarily prior art.

Electrical contacts in equipment such as communication devices subjected to exposure to conductive fluids such as seawater, chemicals, and including corrosive environments such as salt spray and fog and the like, herein collectively referred to as conductive/corrosive fluids, can suffer electrical contact degradation by electrolysis including galvanic corrosion between terminals, contacts, connecting pins and the like that are energized or connected to a current source (actively signaling or power supply). Exposure to conductive/corrosive fluids can rapidly oxidize the connectors. Active methods to obviate corrosion include manual disablement of the electrical interface. This method is not effective if the operator fails to disable the interface. Passive methods are known which further seal the terminal or pin areas which commonly include addition of covers, fasteners, seal members such as O-rings, and/or sealants. Access requirements to incorporate the fasteners, seal members or sealants however, can themselves introduce additional paths for the conductive/corrosive fluid entrance, and thus may exacerbate the corrosion problem.

SUMMARY

This section provides a general summary of the disclosure, and is not a comprehensive disclosure of its full scope or all of its features.

According to several embodiments of the present disclosure, a monitoring system for conductor pins exposed to conductive/corrosive fluids and corrosive environments includes a first sensing portion having a pin monitoring section adapted to measure a pin current flow of at least one conductor pin, compare the pin current flow to a predetermined range of values, and produce a first signal. A decision logic device receives the first signal and isolates electrical power to the at least one pin when the first signal indicates the pin current flow of the at least one conductor pin is outside of the predetermined range of values.

According to other embodiments, a monitoring system for conductor pins exposed to conductive/corrosive fluids includes a first sensing portion having a pin monitoring section operating to measure a pin current flow of at least one conductor pin, compare the pin current flow to a predetermined range of values, and produce a first signal. A second sensing portion produces a second signal indicating by a contactless determination the presence of a fastener providing physical connection between an interface member and a component having the at least one conductor pin positioned therein. A decision logic device receiving the first and second signals isolates electrical power to the at least one pin when the first signal indicates the pin current flow of at least one conductor pin is outside of the predetermined range of values.

According to still further embodiments, a monitoring system for monitoring a current draw through a plurality of conductor pins includes a component such as a cabinet. A sensor body created of a non-ferrous material connected to the component includes a first insert member having a first plurality of conductor pins extending therefrom. A second insert member defines a sensor to sense proximal presence of a fastener. A blind fastener engagement aperture is created in the sensor body proximal to the second insert member and is spaced from the sensor by a body wall of the non-ferrous material. An interface member has a second plurality of conductor pins extending therefrom. The interface member is releasably connected to the component having individual ones of the first plurality of conductor pins connected to individual ones of the second plurality of conductor pins. A fastener coupled to the interface member has an engagement end extending beyond the interface member and engaged within the fastener engagement aperture of the sensor body to releasably connect the interface member to the component. The sensor senses a presence of the engagement end and creates a fastener present signal indicating presence of the engagement end.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
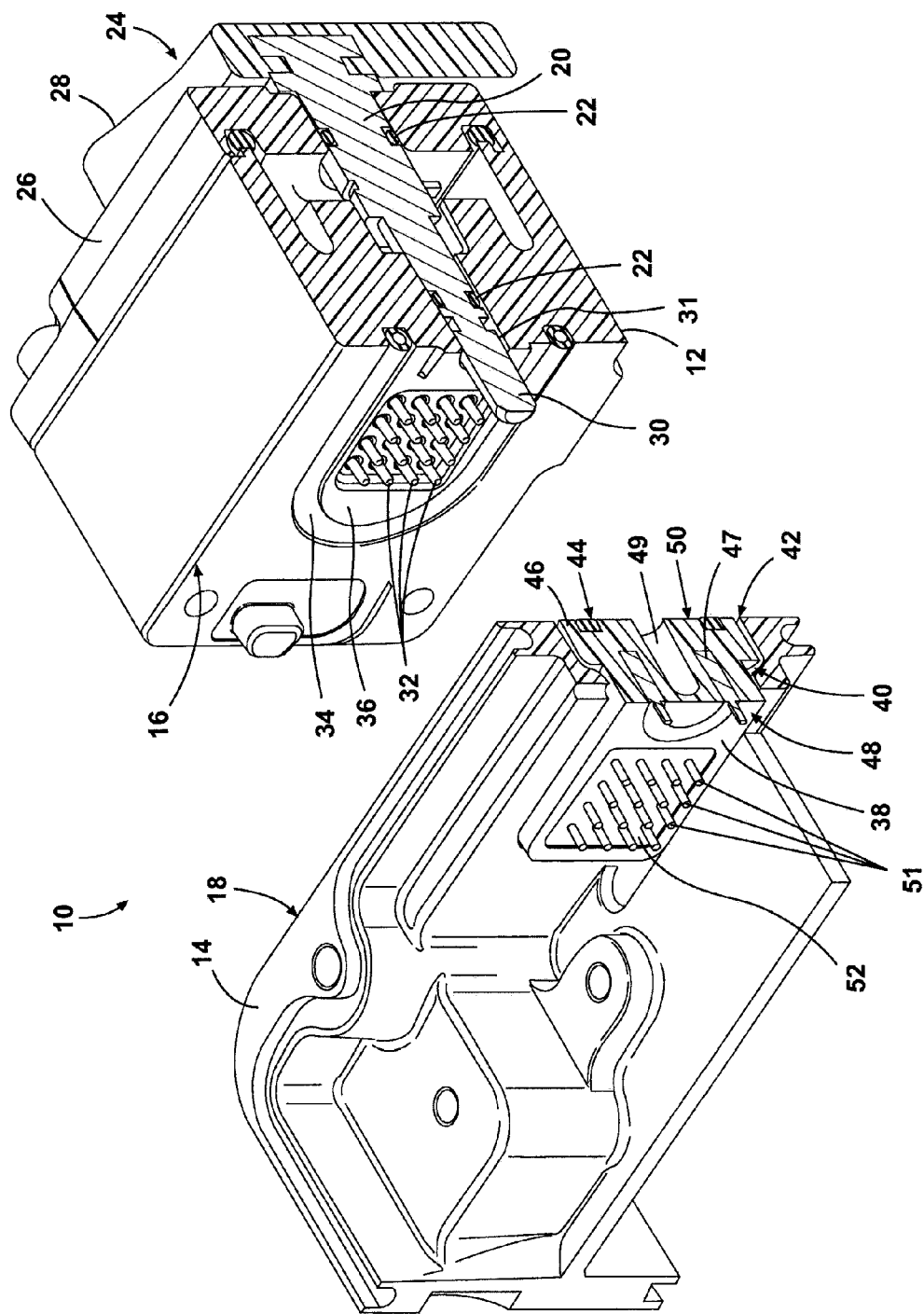
FIG. 1 is front perspective view of unassembled components of an electronic device assembly.

Example embodiments will now be described more fully with reference to the accompanying drawings and are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Referring to FIG. 1, an electronic device assembly 10, such as a communication device or a radio assembly includes an interface member 12, which is releasably connected to a component 14 such as a cabinet or chassis. Interface member 12 includes an interface mount surface 16 which is abutted to and fastenably connected to component 14 and at a cabinet mount surface 18 of component 14. At least one and according to several embodiments a plurality of fasteners 20 can be used to releasably connect interface member 12 to component 14. Each of the fasteners 20 can include one or a plurality of fastener seal members 22 such an O-rings which seal the fastener 20 within the receiving-aperture of interface member 12 through which fasteners 20 extend to prevent liquid entrance through the receiving-aperture.

A front panel surface 24 of electronic device assembly 10 can include a front panel 26, which commonly includes items such as operational control knobs or buttons and viewing displays, can also be releasably connected to interface member 12. In addition, one or more protective members 28, such as molded plastic members, can be attached to the front panel 26 to provide a standoff distance from front panel 26 for protection of the various control features connected thereto. Each fastener 20 includes a fastener engagement end 30, which is threaded and extends through and beyond a fastener receiving-aperture 31 that extends entirely through interface member 12.

Interface member 12 can further include a plurality of first connector or conductor pins 32 extending from interface mount surface 16, which can be surrounded by a first seal member 34, such as an O-ring. A sealed pin area 36 is therefore created defining a sealed boundary within first seal member when interface member 12 is connected to component 14. Conductive/corrosive fluid and/or corrosive environments, which may enter the space between interface mount surface 16 and cabinet mount surface 18, is therefore normally isolated from first conductor pins 32 by first seal member 34. The fastener seal members 22 of fasteners 20 further isolate sealed pin area 36 from conductive/corrosive fluids and/or corrosive environments present at the front panel surface 24 from entering sealed pin area 36 via fastener receiving-aperture 31.

A sensor body 38 made predominantly from a non-conductive material, such as a non-ferrous material (including aluminum or polymeric materials), is fixedly received in component 14 in a sensor receiving cavity 42. Sensor body 38 can be fixed in sensor receiving cavity 42 by a threaded connection of sensor body 38, a sealing member (not shown in this view) between sensor body 38 and the walls of sensor receiving cavity 42, or a sealant such as a sensor body seal 40 positioned about a perimeter of sensor body 38. Sensor body 38 can optionally include a sensor seal 44, such as an O-ring or gasket material positioned within a cavity of sensor body 38, which faces and seats against sealed pin area 36 of interface member 12 when interface member 12 and component 14 are releasably connected. Sensor seal 44 can also be used in place of first seal member 34. A seal engagement member 46, which can be substantially flush with cabinet mount surface 18 or extend beyond cabinet mount surface 18 toward interface mount surface 16, is also provided.

Seal engagement member 46 contacts first seal member 34 when interface member 12 is joined to component 14. A sensor element 47, which according to several embodiments is a Hall effect sensor or other non-direct contact sensor, is accessible via a first body face 48 of sensor body 38. Sensor element 47 can be inserted into or molded into sensor body 38. Sensor element 47 can also be any of a plurality of sensor designs that are capable of sensing a magnetic field or material, including a reed sensor, or capacitance sensor. A threaded fastener engagement aperture 49 extends partially into sensor body 38 from a second body face 50, which is oppositely oriented with respect to first body face 48. Threaded fastener engagement aperture 49 is a blind aperture having no opening through the first body face 48 and, therefore, offers no path for conductive/corrosive fluid and/or corrosive environments to pass through threaded fastener engagement aperture 49. A plurality of second conductor pins conductively connect with individual ones of the first conductor pins 32 of interface member 12. Each of the second conductor pins is retained in an insert member 52 such as a potting material, which can be either individually inserted into sensor body 38 or poured into sensor body 38.

Figure 2:
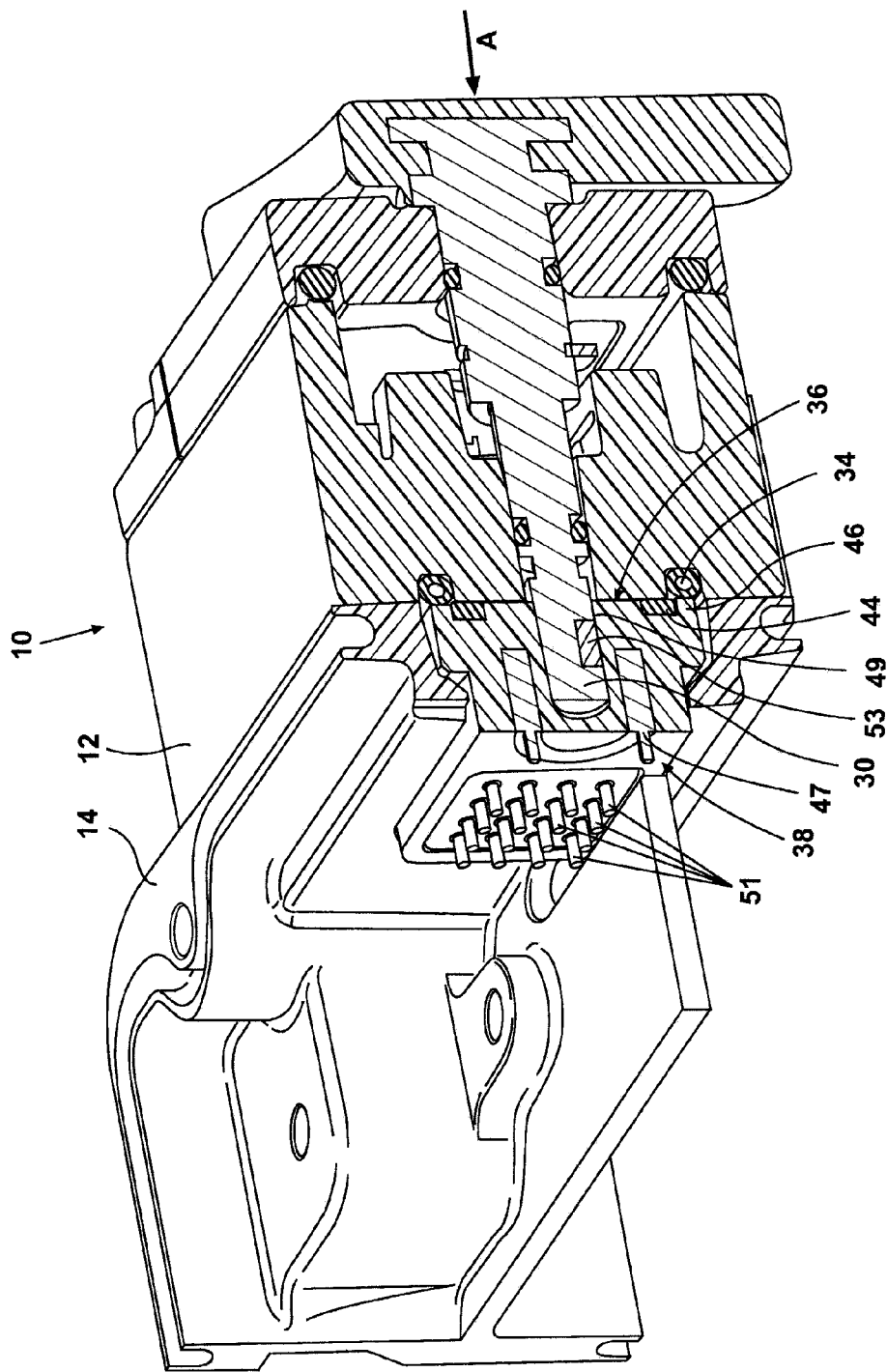
FIG. 2 is a front perspective view of the electronic device assembly of FIG. 1 following component assembly.

Referring to FIG. 2 and again to FIG. 1, electronic device assembly 10 is shown following connection between interface member 12 and component 14 having fastener engagement end 30 of fastener 20 threadably engaged into threaded fastener engagement aperture 49 of sensor body 38. Insertion of fastener engagement end 30 in a direction "A" pulls component 14 towards interface member 12. In the connected condition shown, sensor seal member 34 abuts against, and, therefore seals against cabinet mount surface 18 creating sealed pin area 36.

Fastener 20 is a ferrous or magnetic material, or can include an insert of ferrous material. Therefore, when fastener engagement end 30 is received in threaded fastener engagement aperture 49, the fastener engagement end 30 will be sensed by sensor element 47. If fastener 20 is a non-ferrous or non-magnetic material, a magnetic or ferrous material insert 53 can be included at fastener engagement end 30 to provide the necessary proximity indication of fastener engagement end 30. Although sensor element 47 is described herein with reference to a Hall effect sensor or a reed sensor, other contactless proximity devices can also be used, such as capacitance sensors, pressure sensors or radio frequency tags positioned at each of sensor body 38 and fastener engagement end 30. In each embodiment of the present disclosure, however, sensor element 47 is intended to provide a "contactless" device defined as a presence indication device where physical contact between fastener engagement end 30 and sensor element 47 is not required.

Figure 3:
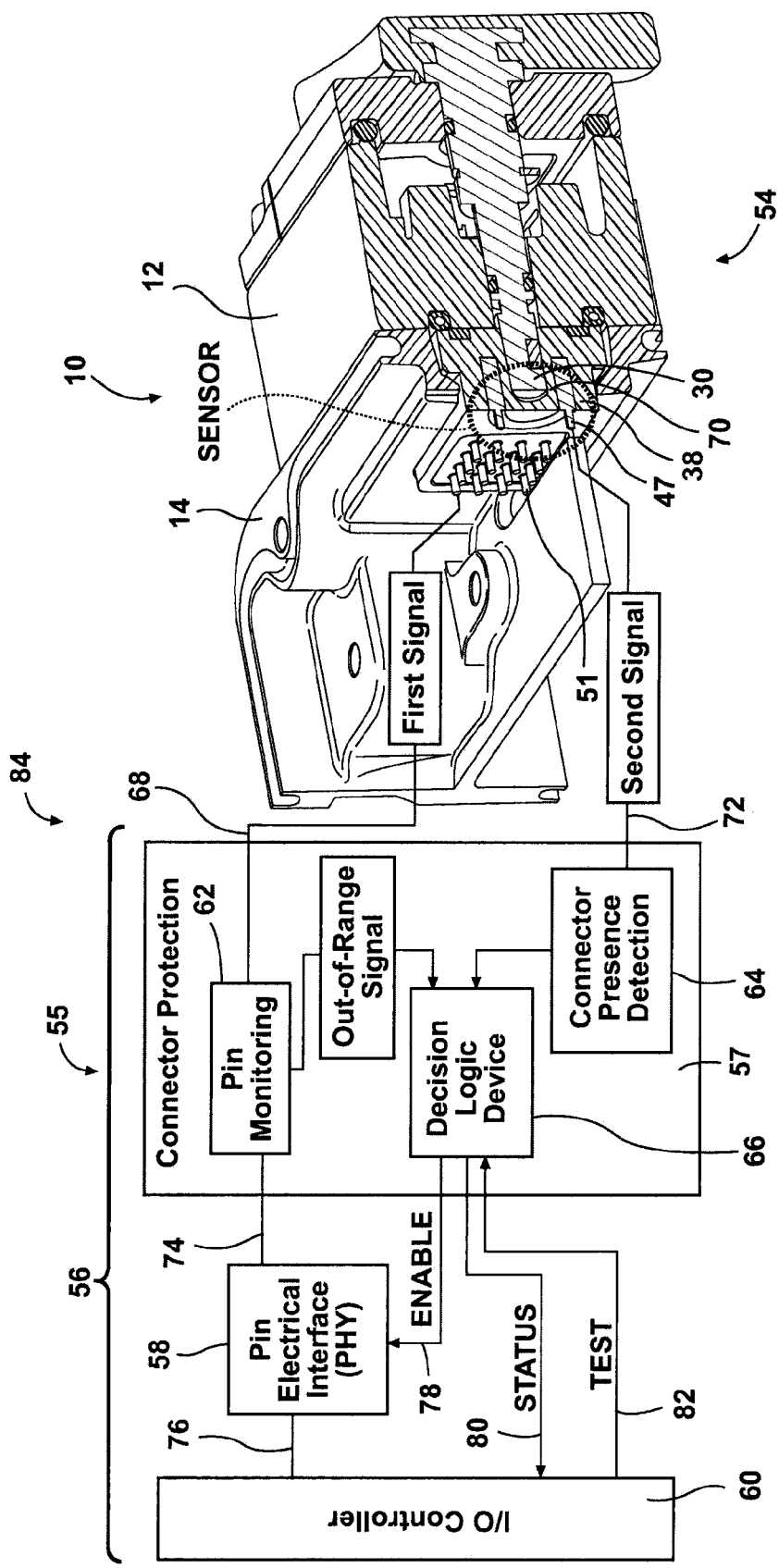
FIG. 3 is a diagrammatic view of a monitoring system including the assembled electronic device of FIG. 2.

Referring to FIG. 3, a first sensing portion 54 is created when electronic device assembly 10 is in the assembled condition. A second sensing portion 55 communicates with the first sensing portion 54. Second sensing portion 55 can include a monitor and control system 56, which can include a plurality of components mounted, for example, on a printed circuit board or positioned independently of each other. Monitor and control system 56 can include a connector protection portion 57, a pin electrical interface 58, and an I/O controller 60. According to several embodiments of the present disclosure, connector protection portion 57 can include a pin monitoring section 62, a connector presence detection section 64, and a protection decision logic device 66.

Pin monitoring section 62 is connected to the plurality of second conductor pins, for example, by a conductor device 68 such as a wire bundle or a flex tape. Pin monitoring section 62 is capable of monitoring operation in three different modes of operation. In a first mode, when current flow through the second conductor pins is not anticipated such as during a down-powered state, pin monitoring section 62 can be operated in a sleep/sniff mode, wherein pin monitoring system 62 periodically awakes from the sleep mode and sniffs or measures for a detectable current flow through the second conductor pins.

According to further embodiments, decision logic device 66 can contain information concerning a predetermined range of current values (or other measured values). In one exemplary operation a normal current value at a power pin included with the second conductor pins is approximately 200 milliamps, therefore an exemplary "predetermined range" for this current can be 200 milliamps +/−2%. When power is isolated to the second conductor pins the measured current value should be zero. If a conductive/corrosive fluid and/or corrosive environment has contacted any of the first or second conductor pins 32, 51 and corrosion has occurred, a current value measured outside of the predetermined range, for example in a micro-Amp range could be anticipated. When a zero current value is expected, current sensed by pin monitoring section 62 measured outside the predetermined range (including the exemplary micro-Amp current value) will generate a digital first or pin current Out-Of-Range signal sent to decision logic device 66 indicating a contamination environment may be present.

The "predetermined range" of values as defined herein is based on several factors, including 1) whether the sensing portion of the system measures current, voltage, resistance, inductance or other value; 2) a determination by the system designer of an appropriate normal sensing range for the sensing portion; and 3) an anticipated measurement that indicates corrosion has occurred or a corrosive environment has been encountered by one of more of the conducting pins. For example, the sensing portion can have current or voltage values established as low end and high end values with all values between the low and high end values included. For this example a predetermined range can be 50 to 100 milliamps, or 10 to 14 volts. The predetermined range can also be a percentage of an expected current, voltage or other value, for example 12 volts DC +/−5%. As a further non-limiting example the predetermined range can be a nominal or normal expected value with a plus/minus variance, such as 10 milliamps +/−1 milliamp. The Out-Of-Range signal is therefore sent when the measured value is outside of the predetermined range.

Decision logic device 66 receives the first signal from pin monitoring section 62 and decision logic device 66 performs the comparison of the current (or other) value received from pin monitoring section 62 to the predetermined range of current (or other) values to identify if the current (or other) value is of out of the predetermined range of values. Decision logic device 66, upon receipt of the first or Out-Of-Range signal can decide that all power to the particular pin or pins should be isolated, or that power to an individual pin should be isolated. In each of the first and a second operating mode, second sensing portion 56, via connector presence detection section 64 produces a second or fastener present signal indicating by a contactless determination the presence of fastener 20 which establishes electrical connection of electronic device assembly 10.

In the second mode of operation pin monitoring section 62 measures current at one or more of the second conductor pins to determine if current flow is being degraded from an expected value due to contamination environment exposure of the pin or pins. During normal powered operation of the second conductor pins and using the exemplary expected current flow of 200 milliamps, if the measured current is degraded below a pre-determined threshold (for example to 190 milliamps, or a 10% reduction), contamination by a conductive/corrosive fluid and/or corrosive environments and therefore corrosion or exposure to a corrosive environment may be indicated. The second mode of operation can also be initiated when the pin connection is faulty, for example by being incompletely inserted and therefore unable to create an electrical connection, or providing a power level below the expected power level.

In the second mode of operation, a modified first signal is generated by pin monitoring section 62 and received by both pin electrical interface 58 and decision logic device 66, indicating the reduced power level. When either the first or modified first signals of pin monitoring section 62 is generated during either the first or second modes of operation, decision logic device 66 provides a status signal to I/O controller 60 and an enable/disable signal to pin electrical interface 58. The first and second modes of operation both require that sensor element 47 indicate presence of fastener engagement end 30 by the second signal transferred between sensor 47 and connector presence detection section 64 via a conductor 72. Conductor 72 can be, for example, a wire bundle or a flex tape. A non-ferrous body wall 70 defining a portion of sensor body 38 is maintained between fastener engagement end 30 and any portion of sensor element 47 to ensure that the contactless condition is created for sensor body 38. Non-ferrous body wall 70 precludes conductive/corrosive fluid passage through fastener engagement aperture 49.

A third mode of operation is provided when interface member 12 is not connected to component 14 such as when fastener engagement end 30 is not sensed by sensor element 47. In the third mode of operation pin monitoring section 62 will be periodically queried and an anticipated zero current flow is expected through any of the second conductor pins. The rate of query (time interval between sleep cycles to test query) can be, for example, every 10-15 seconds during the third mode because no electrical connections are made and therefore no current flow is expected, and the opportunity for contamination by conductive/corrosive fluids and/or corrosive environments is reduced (the equipment is substantially "off-line"). Again, a measured current (for example in the predetermined micro-Amp range) at any of the second conductor pins may indicate contamination and subsequent corrosion at the conductor.

The signals sent by pin monitoring section 62 to pin electrical interface 58 are communicated via a signal interface path 74, and the signals forwarded from pin electrical interface 58 to I/O controller 60 are communicated via a signal interface path 76. Decision logic device 66 can forward signals to pin electrical interface 58 via an enable/disable interface path 78. Pin electrical interface 58 can function as a conversion device to convert the signals of a pin monitoring section 62 or decision logic device 66 microprocessor to a different format, for example, a format required for a signaling device such as RS-232 format or in USB format. This permits interface between connector protection portion 57 and I/O controller 60 to additional equipment (not shown).

In each of the first and second operating modes, fastener engagement end 30 is sensed by sensor element 47 and pin monitoring section 62 operates by sensing/measuring a current flow at one or more of the second conductor pins. According to further embodiments, sensor element 47 can also produce a signal when a predetermined voltage potential is measured at specific ones of second conductor pins.

Decision logic device 66 can forward a status signal via a status signal interface path 80 to I/O controller 60 and can receive a signal from I/O controller 60, for example, as a test command via a test request signal interface path 82. One function of decision logic device 66, when receiving a signal from pin monitoring section 62, is to identify when an out-of-range or predetermined threshold current value exists at any of the second conductor pins, which may be indicative of the presence of a conductive/corrosive fluid and/or corrosive environments or corrosion damage therefrom. The status signal sent by decision logic device 66 in this condition, via status signal interface path to I/O controller 60, provides input for I/O controller 60 which can, for example, signal a secondary device (not shown) to provide audible or visual indication of a contamination possibility.

As previously noted, decision logic device 66, during the sleep/sniff operating mode, can be periodically awakened by I/O controller 60 by a test signal via test request signal interface path 82. Decision logic device 66 then queries one or more of the second conductor pins via pin monitoring section 62. Decision logic device 66 receives the signals from pin monitoring section 62 and can collectively down power the electronic device assembly 10 or down power individual ones of the second conductor pins. During the first and second modes of operation, the rate of query (time interval between sleep cycles to test query) is shorter than during the third mode of operation, for example once per second, because early indication of powered operation is desired when a connection is initially made to second conductor pins or current begins to flow through any of second conductor pins.

A monitoring system 84 is created by the combination of electronic device assembly 10 and monitoring and control system 56. Monitoring system 84 provides the benefit of a contactless sensor, such as a Hall effect sensor in the position of sensor element 47. Monitoring system 84 provides the capability of detecting when contamination by a conductive/corrosive fluid and/or corrosive environments may be occurring and provides the capability to down power portions or all of the system, thereby protecting the integrity of the electrical components therein. Monitoring system 84 provides the capability of a fully automatic monitoring system and does not require manual interface upon detection of a conductive/corrosive fluid and/or corrosive environments or degraded current flow.

Any pin of second conductor pins having a voltage potential or current flow between itself and one or more of the other conductive pins or when further connected to a device (not shown) is monitored for current flow and/or signal integrity. If the measured current is outside of the expected or predetermined current range then the pin or pins sourcing this current can be electrically disconnected by decision logic device 66. In addition, if a pin is found to be sourcing current but the signal integrity cannot be established, then unintended current paths are assumed to be present which could compromise the electronic device assembly 10. In this situation monitoring system 84 will remove power from the pin(s) in which current flow is detected.

Pin monitoring section 62 can include devices for current and/or voltage measurement, such as op-amplifiers, comparators, or high impedance current amplifiers which are connected across the resistive element (conductor pin) producing a gain. Windowing can be performed on the output to identify if the measured amperage or voltage is outside of a predetermined threshold.

Connector presence detection section 64 can, in a first condition, provide a fastener present or fastener absent indication from sensor element 47. A fastener present indication results from proximity of fastener engagement end 30 of fastener 20 to sensor element 47. The fastener 20 is present for the first and second operating modes and is absent for the third operating mode. Connector presence detection section 64 can, in a second condition, indicate by a strong signal strength a fully seated condition of fastener 20, and by a weaker signal strength a non-fully seated condition of fastener 20. Remedial action can be taken upon indication of the weaker signal strength to re-torque fastener 20.

Decision logic device 66 is a logic device such as a programmable micro-controller or a state machine. Profiles of each individual second conductor pin 51 are stored in decision logic device 66, so that a predetermined current or voltage at each of the pins during the various operating modes is saved, and can be used as a baseline against which is compared the measured current or voltage determined by pin monitoring section 62.

Pin electrical interface 58 (PHY) can be enabled or disabled by signals from decision logic device 66. Pin electrical interface 58 will be disabled for example when the current or voltage at any one of the second conductor pins is outside of the threshold values stored in decision logic device 66 to protect pin electrical interface 58. I/O controller 60 is a high level device that can communicate with outside devices (not shown), can over-ride decision logic device 66 when sending a test request for data from one or more pins, and can communicate the system status to the outside device(s).

Monitoring system 84 can be used to monitor systems having conductor pins exposed to conductive fluids such as seawater, chemicals, and/or to corrosive environments such as salt spray, fog and the like, herein collectively referred to as conductive/corrosive fluids. Conductor pins exposed to conductive/corrosive fluids can suffer electrical contact degradation by electrolysis including galvanic corrosion between terminals, contacts, connecting pins and the like that are energized or connected to a current source (actively signaling).

Monitoring system 84 employs a periodic sampling approach to reapply power to individual ones of second conductor pins in the electronic device assembly 10 to detect if the situation which could compromise electronic device assembly 10 is resolved or if correct connector mating has occurred. Monitoring system 84 can therefore provide power to one or more of the pins for brief intervals when in a down-powered state. Since these periods are minimized and brief, the risk of connector damage is reduced or eliminated. Monitoring system 84 provides an additional benefit of conserving system power by eliminating unintended current paths. According to several embodiments a contactless approach is used to detect a mated connector pairing using a Hall effect or similar magnetic detection sensor with a sensor-detectable mounting screw (e.g., fastener engagement end 30 of fastener 20). The contactless sensor system is used to isolate the sensor from system fluid to ensure that addition of the fastener detection sensor does not add further contamination paths for conductive/corrosive fluid to enter the system. Alternative contactless methods can also be used in place of the Hall effect sensor as sensor element 47, including but not limited to inductive loops, optical sensors, pressure sensors, and/or radio frequency (RF) signaling or RF tags.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A monitoring system for conductor pins exposed to conductive/corrosive fluids, comprising:
   a first sensing portion having a pin monitoring section to measure a pin current flow of at least one conductor pin, compare the pin current flow to a predetermined range of values, and produce a first signal indicative of the pin current flow; and
   a second sensing portion configured to produce a second signal indicative by a contactless determination the presence of a fastener providing physical connection between an interface member and a component having the at least one conductor pin positioned therein; and
   a decision logic device to receive the first and second signals and isolating electrical power to the at least one conductor pin when the first signal indicates the pin current flow of at least one conductor pin is outside of the predetermined range of values.

2. The monitoring system of claim 1, further including a sensor body created of a non-ferrous material connected to the component, the sensor body including a first insert member having the at least one conductor pin extending therefrom.

3. The monitoring system of claim 2, wherein the sensor body further includes a second insert member defining a contactless sensor to sense proximal presence of the fastener.

4. The monitoring system of claim 3, wherein the sensor body further includes a blind fastener engagement aperture created in the sensor body proximal to the second insert member and spaced from the sensor by a body wall of the non-ferrous material, the fastener extending from the interface member and received in the engagement aperture.

5. The monitoring system of claim 3, wherein the contactless sensor comprises one of a Hall effect sensor, a reed sensor, an optical sensor, a pressure sensor, or a radio frequency tag.

6. The monitoring system of claim 2, wherein the interface member includes a seal member engaged by a seal engagement member of the sensor body when the seal member contacts the component.

7. The monitoring system of claim 1, wherein the at least one conductor pin comprises a first plurality of conductor pins, and wherein the interface member includes a second plurality of conductor pins, individual ones of the second plurality of conductor pins connected to individual ones of the first plurality of conductor pins when the fastener releasably couples the interface member to the component.

8. An electronic device assembly, comprising
   a chassis having a cavity;
   a connector subassembly disposed in the cavity and includes:
      a first connector having a plurality of conductor pins extending therefrom;
      a pin monitor section operable to measure current flow through at least one of the plurality of conductor pins and produce a first signal indicative of the current flow;
      a contactless sensor operable to detect presence of a fastener and produce a second signal indicative of presence of the fastener, wherein the fastener releasably connects a second connector to the first connector; and
   a controller configured to receive the first signal and the second signal and operable to compare the current flow to a threshold, wherein value for the threshold depends on value of the second signal.

9. The electronic device assembly of claim 8 wherein the connector subassembly is comprised of a non-ferrous material.

10. The electronic device assembly of claim 8 wherein the connector subassembly includes a blind fastener engagement aperture created therein proximal to the contactless sensor and spaced from the contactless sensor by a body wall of the non-ferrous material, such that the fastener is received in the engagement aperture.

11. The electronic device assembly of claim 8 wherein the contactless sensor includes one of a Hall effect sensor, a reed sensor, an optical sensor, or a pressure sensor.

12. The electronic device assembly of claim 8 further comprises a second connector having a plurality of conductor pins electrically coupled to the plurality of conductor pins of the first connector when the fastener couples the second connector to the first connector.

13. The electronic device assembly of claim 8 wherein the controller compares the current flow to a threshold having a first value when a fastener is present and compares the current flow to a threshold having a second value when the fastener is absent.

14. The electronic device assembly of claim 13 wherein the controller determines whether current flow is expected through the plurality of conductor pins based on an operating state of the electronic device and compares the current flow to a threshold having the first value when current flow is expected and compares the current flow to a threshold having a second value when a fastener is present but current flow is not expected.

15. An electronic device assembly, comprising
a first connector having a first plurality of conductor pins extending therefrom;
a chassis having a cavity;
a connector subassembly disposed in the cavity and includes:
   a second connector having a second plurality of conductor pins and adapted to releasably couple to the first connector, such that the first plurality of conductor pins are electrically coupled to the second plurality of conductor pins;
   a pin monitor section operable to measure current flow through at least one of the second plurality of conductor pins and produce a first signal indicative of the current flow;
   a sensor configured to detect presence of a fastener in a contactless manner and produce a second signal indicative of presence of the fastener, wherein the fastener releasably connects the second connector to the first connector; and
a controller configured to receive the first signal and the second signal and operable to compare the current flow to a threshold, wherein the threshold having a first value when a fastener is present and a second value when the fastener is absent.

16. The electronic device assembly of claim 15 wherein the connector subassembly is comprised of a non-ferrous material.

17. The electronic device assembly of claim 15 wherein the connector subassembly includes a blind fastener engagement aperture created therein proximal to the contactless sensor and spaced from the contactless sensor by a body wall of the non-ferrous material, such that the fastener is received in the engagement aperture.

18. The electronic device assembly of claim 15 wherein the contactless sensor includes one of a Hall effect sensor, a reed sensor, an optical sensor, or a pressure sensor.

19. The electronic device assembly of claim 18 wherein the controller determines whether current flow is expected through the plurality of conductor pins based on an operating state of the electronic device and compares the current flow to a threshold having the first value when current flow is expected and compares the current flow to a threshold having a second value when a fastener is present but current flow is not expected.

* * * * *